US006413694B1

(12) United States Patent
Zheng et al.

(10) Patent No.: US 6,413,694 B1
(45) Date of Patent: *Jul. 2, 2002

(54) PROCESSLESS IMAGING MEMBER CONTAINING HEAT SENSITIVE SULFONATE POLYMER AND METHODS OF USE

(75) Inventors: Shiying Zheng, Rochester; Thap Dominh, Webster, both of NY (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/431,706

(22) Filed: Nov. 1, 1999

Related U.S. Application Data

(63) Continuation-in-part of application No. 09/399,191, filed on Sep. 17, 1999, now Pat. No. 6,146,812, which is a continuation-in-part of application No. 09/156,833, filed on Sep. 18, 1998, now Pat. No. 5,985,514.

(51) Int. Cl.[7] .......... G03F 7/038

(52) U.S. Cl. .......... 430/270.1; 430/278.1; 430/281.1; 430/302

(58) Field of Search .......... 430/270.1, 278.1, 430/275.1, 281.1, 283.1, 286.1, 287.1, 944, 945, 302, 303

(56) References Cited

U.S. PATENT DOCUMENTS

| | | | | | |
|---|---|---|---|---|---|
| 3,658,534 | A | | 4/1972 | Ishitani et al. | 96/48 |
| 3,964,389 | A | | 6/1976 | Peterson | 101/467 |
| 4,034,183 | A | | 7/1977 | Uhlig | 219/122 |
| 4,081,572 | A | | 3/1978 | Pacansky | 427/53 |
| 4,405,705 | A | | 9/1983 | Etoh et al. | 430/270 |
| 4,548,893 | A | | 10/1985 | Lee et al. | 430/296 |
| 4,634,659 | A | | 1/1987 | Esumi et al. | 430/302 |
| 4,693,958 | A | | 9/1987 | Schwartz et al. | 430/302 |
| 4,973,572 | A | | 11/1990 | DeBoer | 503/227 |
| 5,168,288 | A | | 12/1992 | Baek et al. | 346/76 |
| 5,339,737 | A | | 8/1994 | Lewis et al. | 101/454 |
| 5,372,915 | A | | 12/1994 | Haley et al. | 430/302 |
| 5,460,918 | A | | 10/1995 | Ali et al. | 430/200 |
| 5,488,025 | A | | 1/1996 | Martin et al. | 503/227 |
| 5,512,418 | A | | 4/1996 | Ma | 430/271.1 |
| 5,569,573 | A | | 10/1996 | Takahasi et al. | 430/138 |
| 5,574,493 | A | | 11/1996 | Sanger et al. | 347/262 |
| 5,713,287 | A | | 2/1998 | Gelbart | 101/467 |
| 5,731,123 | A | * | 3/1998 | Kawamura et al. | 430/176 |
| 5,891,603 | A | | 4/1999 | Kodama et al. | 430/270.1 |
| 5,922,512 | A | | 7/1999 | DoMinh | 430/302 |
| 5,985,514 | A | * | 11/1999 | Zheng et al. | 430/270.1 |
| 6,007,964 | A | * | 12/1999 | Kawamura et al. | 430/278.1 |
| 6,017,677 | A | * | 1/2000 | Maemoto et al. | 430/270.1 |
| 6,096,471 | A | * | 4/2000 | Van Damme et al. | 430/188 |
| 6,153,352 | A | * | 11/2000 | Oohashi et al. | 430/270.1 |
| 6,162,578 | A | | 12/2000 | Zheng et al. | 430/270.1 |
| 6,214,515 | B1 | * | 4/2001 | Van Damme et al. | 430/188 |

FOREIGN PATENT DOCUMENTS

| | | |
|---|---|---|
| CA | 1050805 | 3/1979 |
| DE | 19954633 | 6/2000 |
| EP | 293058 | 11/1988 |
| EP | 0293058 | 11/1988 |
| EP | 0341825 | 11/1989 |
| EP | 615162 | 9/1994 |
| EP | 0652483 | 5/1995 |
| EP | 0773478 | 5/1997 |
| EP | 0803775 | 10/1997 |
| EP | 0855267 | 7/1998 |
| EP | 0869394 | 10/1998 |
| EP | 922570 | 6/1999 |
| EP | 938972 | 9/1999 |
| EP | 0938972 | 9/1999 |
| EP | 941389 | 9/1999 |
| EP | 0941839 | 9/1999 |
| JP | 9-197671 | 9/1997 |
| WO | 9209934 | 6/1992 |
| WO | WO 0016987 | 3/2000 |

OTHER PUBLICATIONS

Miall, L. and D.W.A. Sharp, eds. A New Dictionary of Chemistry, Fourth Edition. London: Longman Group Limited, 1968.*

Pappas et al., Kinetick Parmaeter Considerations for Maximizing Stability and Minimizing Cure Temperature of Thermosetting Coatings, *J. of Coatings Technology*, vol. 53 (675) pp. 43–51.

Kamogawa et al., "Conversions of Carbonyl Compounds via Their Polymeric Sulfonylhydrazones into Alkenes, Alkanes, and Nitriles", *Bul. Chem. Soc. Jp.*, vol. 56, No. 3 (1983) pp. 762–765.

Shirai et al., "Novel Photocrosslinkable Polymers with Pendant Imino Sulfonate Groups", *J. of Polymer Science, Part C: Polymer Letters*, vol. 24, (1986) pp. 119–124.

Ballini et al., "Amberlyst A–21 an Excellent Heterogeneous Catalyst for the Conversion of Carbonyl Compounds to Oxides", *Chem. Soc. of Jp., Chemical Letters* (1997) pp. 475–476.

Research Disclosure 19201, 1980.

International IARZIGAI conference Abstract 02–79–02834, 1979.

TAGA Proceedings 1976, p. 174.

TAGA Proceedings 1975, p. 120.

TAGA Proceedings 1975, p. 177.

TAGA Proceedings 1975, p. 195.

* cited by examiner

*Primary Examiner*—Janet Baxter
*Assistant Examiner*—Barbara Gilmore
(74) *Attorney, Agent, or Firm*—Baker Botts L.L.P.

(57) ABSTRACT

A positive-working imaging member is composed of a heat-sensitive surface imageable layer having a heat-sensitive polymer containing heat-activatable sulfoimino, sulfoalkyl, or sulfoamide groups, and a photothermal conversion material. Upon application of thermal energy, such as from IR irradiation, the sulfonate groups decompose rendering exposed areas more hydrophilic. The exposed imaging member can be contacted with a lithographic printing ink and used for printing without post-imaging wet processing. This imaging member is particularly useful for direct write imaging using IR lasers or thermal printing heads.

22 Claims, No Drawings

PROCESSLESS IMAGING MEMBER CONTAINING HEAT SENSITIVE SULFONATE POLYMER AND METHODS OF USE

CROSS-REFERENCE TO RELATED APPLICATION

This application is a continuation-in-part application of copending application U.S. Ser. No. 09/399,191 for "Imaging Member Containing Switchable Polymers and Method for Use" filed Sep. 17, 1999, now U.S. Pat. No. 6,146,812, which is incorporated in full herein by reference, which is a continuation-in-part application of U.S. Ser. No. 09/156,833, filed Sep. 18, 1998, now U.S. Pat. No. 5,985,514.

FIELD OF THE INVENTION

This invention relates in general to direct write, processless imaging members, and particularly to heat-sensitive imaging members, that require no wet processing after imaging. The invention also relates to methods of digital imaging and printing using these imaging members.

BACKGROUND OF THE INVENTION

The art of lithographic printing is based upon the immiscibility of oil and water, wherein an oily material or ink is preferentially retained in certain areas and the water or fountain solution is preferentially retained in other areas, depending upon the type of image produced. When a suitably prepared surface is moistened with water, and ink is then applied, either a positive or negative image is obtained, depending upon whether the imaged or non-imaged areas are ink-accepting. The ink is eventually transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are less common. Examples of such plates are described in U.S. Pat. No. 5,372,915 (Haley et al). They include an imaging layer comprising a mixture of dissolvable polymers and an infrared radiation absorbing compound. While these plates can be imaged using lasers and digital information, they require wet processing using alkaline developer solutions.

Conventional preparation and use of such printing plates generally involves multiple processing steps such as exposure to either light or heat (or both) through a patterned image, and wet processing with an alkaline developer to provide a printing plate image.

Dry planography, or waterless printing, is well known in the art of lithographic offset printing and provides several advantages over conventional offset printing. Dry planography is particularly advantageous for short run and on-press applications. It simplifies press design by eliminating the fountain solution and aqueous delivery train. Careful ink water balance is unnecessary, thus reducing rollup time and material waste. Silicone rubbers [such as poly(dimethylsiloxane) and other derivatives of poly(siloxanes)] have long been recognized as preferred waterless-ink repelling materials. The criteria for waterless lithography and the ink repelling properties of poly(siloxanes) have been extensively reviewed in the TAGA Proceedings 1975 pages 120, 177 and 195 and 1976 page 174. It was concluded that, in addition to low surface energy, the ability to swell in long-chain alkane ink solvents (i.e., its "oleophilic" nature) accounts for silicone's superior ink releasing characteristics. An important consideration is that siloxane polymers repel ink.

It has been recognized that a lithographic printing plate could be created containing an IR absorbing layer. Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose) and an optional cross-linkable resin. Such plates were exposed to focused near IR radiation with a $Nd^{++}YAG$ laser. The absorbing layer converted the infrared energy to heat thus partially loosening, vaporizing or ablating the absorber layer and the overlying silicone rubber. The plate was developed by applying naphtha solvent to remove debris from the exposed image areas. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. $CO_2$ lasers are described for ablation of silicone layers by Nechiporenko & Markova, PrePrint 15th International IARIGAI Conference, June 1979, Lillehammer, Norway, Pira Abstract 02-79-02834. Typically, such printing plates require at least two layers on a support, one or more being formed of ablatable materials.

"Direct write" imaging eliminates the use of the pattern of light or heat to generate an image. When a laser is used for this purpose, the laser can be used to heat only small regions at a time. Moreover, a computer can be used to produce the high resolution images pixel by pixel. If the plate is processless, chemical development is also eliminated.

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable in resulting printing quality. Typically, such printing plates require at least two layers on a support, one or more being formed of ablatable materials.

Thermally switchable polymers have been described for use as imaging materials in printing plates. By "switchable" is meant that the polymer is rendered either more hydrophilic (or oleophobic) or hydrophobic (or oleophilic) upon exposure to heat.

As an alternative method of preparing printing plates, U.S. Pat. No. 4,634,659 (Esumi et al) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes).

EP-A 0 652 483 (Ellis et al) describes lithographic printing plates imageable using IR lasers, and which do not require wet processing. These plates comprise an imaging layer that becomes more hydrophilic upon the imagewise exposure to heat. This coating contains a polymer having pendant groups (such as t-alkyl carboxylates) that are capable of reacting under heat or acid to form more polar, hydrophilic groups. The problem with such materials is that they are very difficult to manufacture, exhibit poor shelf life, require a photoacid generator for imaging, and are positive-working only. Other lithographic printing plates hydrophilic polymers containing pendant carboxylic acids are described in U.S. Pat. No. 4,081,572 (Pacansky).

Positive-working photoresists and printing plates having crosslinked, UV-sensitive polymers are described in EP-A 0 293 058 (Shirai et al). The polymers contain pendant iminosulfonate groups that are decomposed upon UV exposure, generating a sulfonic group and providing polymer solubility.

U.S. Pat. No. 5,512,418 (Ma) describes the use of cationic polymers containing pendant ammonium groups for thermally induced imaging. However, chemical processing is still required to provide the desired image.

Japanese Kokai 9-197,671 (Aoshima) describes a negative-working printing plate and imaging method in which the imaging layer includes a sulfonate-containing polymer, an IR radiation absorber, a novolak resin and a resole resin. Wet processing with a conventional alkaline developer is required to produce the desired negative image.

Thus, the graphic arts industry is seeking alternative means for providing a processless, direct-write, positive-working lithographic printing plate that can be imaged without ablation and the accompanying problems noted above.

SUMMARY OF THE INVENTION

The problems noted above are overcome with a positive-working imaging member comprising a support having thereon a heat-sensitive surface imageable layer comprising:

a) a heat-sensitive polymer comprising a heat-activatable sulfonate group, and b) a photothermal conversion material, the heat-activatable sulfonate group represented by structure I:

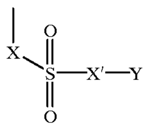

wherein X is a divalent linking group, X' is an oxygen or a sulfur atom, and Y is an imino, an alkyl group, or an amide group.

This invention also includes a method of imaging comprising the steps of:

A) providing the positive-working imaging member described above, and

B) imagewise exposing the imaging member to thermal energy to provide exposed and unexposed areas on the surface of the imaging member, whereby the exposed areas are rendered more hydrophilic than the unexposed areas.

Preferably, the method is carried further with the step of:

C) without wet processing after imaging, contacting the imagewise exposed imaging member with a lithographic printing ink, and imagewise transferring the ink to a receiving material.

The positive-working imaging member of this invention has a number of advantages, thereby avoiding the problems of previous printing plates. Specifically, the problems and concerns associated with ablation imaging (that is, imagewise removal of surface layer) are avoided because imaging is accomplished by "switching" the exposed areas of its printing surface to more hydrophilicity, or oil-repellency. The resulting imaging members display high ink receptivity in non-exposed areas, good chemical resistance and excellent ink/water discrimination. No wet chemical processing (such as processing using an alkaline developer) is needed with the practice of this invention to remove portions of the surface imageable layer.

These advantages are achieved by using a specific heat-sensitive polymer in the surface imageable layer. These polymers have heat-activatable sulfonate groups either in the polymer backbone or pendant thereto. Such heat-activatable groups can include sulfoimino groups, or sulfoalkyl groups substituted with electron withdrawing groups that are described in more detail below.

DETAILED DESCRIPTION OF THE INVENTION

In the lithographic art, materials that release or repel oil-based inks are usually referred to as having "oleophobic", "hydrophilic" or ink-repelling character and, conversely, the terms "oleophilic" and "hydrophobic" are used to describe ink loving or accepting materials.

The imaging members of this invention comprise a support and a surface imageable layer thereon that contains a heat-sensitive composition. The support can be any self-supporting material including polymeric films, glass, metals or stiff papers, or a lamination of any of these three materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 $\mu$m. Another preferred embodiment uses a metal (such as aluminum) sheet having a thickness of from about 100 to about 600 $\mu$m. The support should resist dimensional change under conditions of use. The aluminum and polyester supports are most preferred for lithographic printing plates.

The support may be coated with one or more "subbing" layers to improve adhesion of the final assemblage. Examples of subbing layer materials include, but are not limited to, adhesion promoting materials such as alkoxysilanes, aminopropyltriethoxysilane, glycidoxypropyltriethoxysilane, epoxy functional polymers and ceramics, as well as conventional subbing layer materials used on polyester supports in photographic films. One or more IR radiation reflecting layers, such as layers of evaporated metals can be incorporated between the heat-sensitive layer and the support. In addition, an anti-IR radiation reflection layer can be incorporated in the imaging member if desired.

The back side of the support may be coated with antistatic agents and/or slipping layers or matte layers to improve handling and "feel" of the imaging member.

The imaging member, however, has a surface layer that is required for imaging. This surface imageable layer consists essentially of one or more heat-sensitive polymers as described below, and a photothermal conversion material (described below), and provides the outer printing surface. Because of the particular heat-sensitive polymer(s) used in the imageable layer, the thermally exposed (imaged) areas of the layer are rendered more hydrophilic in nature. The background (unexposed) areas then remain more oleophilic.

In the heat-sensitive layer of the imaging members of this invention, only the heat-sensitive polymer and photothermal conversion material are necessary or essential for imaging. Thus, they are the only essential components of the imageable layer.

Each of the heat-sensitive polymers useful in this invention has a molecular weight of at least 5000, and preferably of at least 8000. The polymers can be vinyl homopolymers or copolymers prepared from one or more ethylenically unsaturated polymerizable monomers that are reacted together using known polymerization techniques, or they can be condensation type polymers (such as polyesters, polyimides, polyamides or polyurethanes) prepared using known polymerization techniques. Whatever the type of polymers, at least 25 mol % of the total recurring units comprise the necessary heat-activatable sulfonate groups.

The heat-sensitive polymers useful in the practice of this invention can be represented by the structure II wherein the sulfonate group is a pendant group:

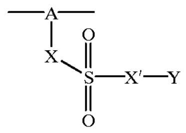

wherein A represents a polymeric backbone, X is a divalent linking group, X' is an oxygen or a sulfur atom, and Y is an imino, an alkyl group, or an amide group. Useful "X" linking groups include substituted or unsubstituted alkylene groups having 1 to 6 carbon atoms (such as methylene, ethylene, n-propylene, isopropylene and butylenes) that can have one or more oxygen, nitrogen or sulfur atoms in the chain, substituted or unsubstituted arylene groups having 6 to 10 carbon atoms in the aromatic ring (such as phenylene, naphthalene and xylylene), substituted or unsubstituted arylenealkylene (or alkylenearylene) having 7 to 20 carbon atoms (such as p-methylenephenylene, phenylenemethylenephenylene, biphenylene and phenyleneisopropylene-phenylene), or the group $—COZ(CH_2)_n—$ wherein Z is an oxy or —NH— group and n is an integer of 1 to 6 (preferably n is 1 to 3).

Most preferably, X is phenylene or $—CONH(CH_2)_3—$.

Preferably, X' is an oxygen atom.

In structure I:

a) If Y is an imino group, Y can be represented by $—N{=}CR_1R_2$ wherein $R_1$ and $R_2$ are independently hydrogen, a substituted or unsubstituted alkyl group having 1 to 10 carbon atoms (such as methyl, ethyl, isopropyl, n-hexyl and n-butyl), a substituted or unsubstituted acyl group having 2 to 10 carbon atoms (such as acetyl), or a substituted or unsubstituted carbocyclic or heterocyclic aromatic group (such as phenyl, naphthyl and anthryl). Alternatively, $R_1$ and $R_2$ taken together can provide the atoms necessary to form a substituted or unsubstituted alicyclic ring having from 5 to 15 carbon, oxygen, nitrogen or sulfur atoms in the ring, such as cyclohexyl, cyclohexenyl, tetralonyl and fluorenyl. Such ring structures are usually nonaromatic in character. Preferably, $R_1$ and $R_2$ are taken together to provide the atoms necessary to form an alicyclic ring having from 5 to 15 carbon atoms in the ring, and more preferably they form an unsubstituted alicyclic ring having from 6 to 14 carbon atoms in the ring.

Preferably, Y is an imino group as defined above, and is derived from α-tetralone, fluorenone or cyclohexenone.

b) If Y is an alkyl group, Y can be represented by $—CHR_3CHR_4R_5$ wherein $R_5$ is an electron withdrawing group, and $R_3$ and $R_4$ are independently hydrogen or a substituted or unsubstituted alkyl group having 1 to 10 carbon atoms (as illustrated above).

An electron withdrawing group is generally known to have a positive Hammett sigma value, and preferably a Hammett sigma value greater than 0.06. Hammett sigma values can be calculated using standard procedures described for example, in *Steric Effects in Organic Chemistry*, John Wiley & Sons, Inc., 1956, pp. 570–574, and in *Progress in Physical Organic Chemistry*, Vol.2, Interscience Publishers, 1964, pp. 333–339. Representative useful electron withdrawing groups include, but are not limited to, cyano, sulfo, carboxy, nitro, halo (for example, fluoro and chloro), trihaloalkyl (such as trichloromethyl), trialkylammonium, carbamoyl, sulfamoyl, sulfinyl, pyridinyl, a substituted or unsubstituted aryl group having 6 to 10 carbon atoms in the ring (particularly aryl groups substituted with one or more electron withdrawing groups), sulfinyl and pyridinyl. Preferably, the electron withdrawing group used is sulfo, carboxy, nitro, or a substituted or unsubstituted aryl group, and most preferably, it is sulfo or phenyl.

c) If Y is an amide group, Y can be represented by —NHCOR wherein R represnets an aliphatic group having 1–12 carbon atoms (such as methyl, ethyl, isopropyl, n-hexyl and n-butyl), an aryl having 6–12 carbon atoms (such as phenyl, naphthyl, and anthryl), or a heteroaryl group having 4–12 carbon atoms (pyridyl, thiophyl, and pyrrolyl).

As the sulfonate group is generally pendant to the backbone, preferably it is part of an ethylenically unsaturated polymerizable monomer that can be polymerized using conventional techniques to form vinyl homopolymers of the sulfonate-containing recurring units, or vinyl copolymers when copolymerized with one or more additional ethylenically unsaturated polymerizable monomers. In all instances, the sulfonate-containing recurring units comprise at least 25 mol % of all recurring units in the polymer, and preferably, they comprise from about 40 to 100 mol % of all recurring units. The polymers can include more than one type of repeating unit containing a sulfonate group as described herein.

Polymers having the above-described iminosulfonate group are thought to switch to hydrophilic sulfonic acid under UV irradiation through the following mechanism, as described in "Microelectronics Technology: Polymers for Advanced Imaging and Packaging" (Chapter 21, pp. 318–332; Reichmanis, et al, Eds. ACS 614,1995):

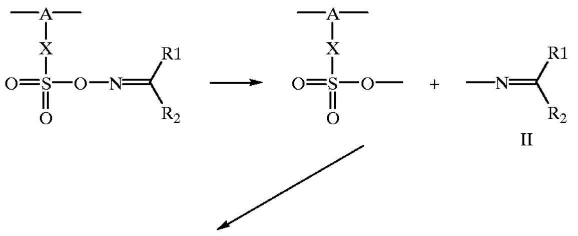

-continued

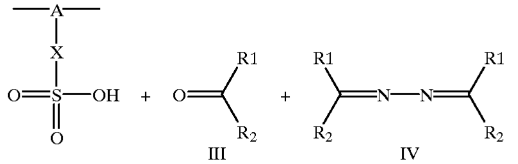

III IV

The liberated free radical II undergoes further decomposition to generate by-product ketone III or two radicals combine to form azine IV. The polymer in the exposed areas is converted to hydrophilic sulfonic acid and rejects ink (in the presence of water) but the unexposed areas are hydrophobic and more readily accept ink. Hence, the imaging member is a positive-working imaging member. Some of the useful sulfoimino groups include:

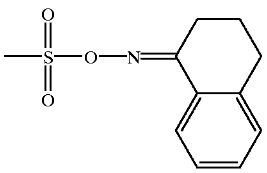

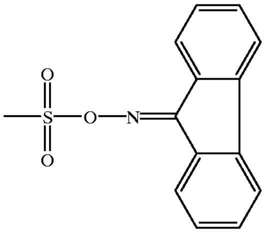

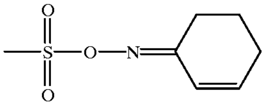

Such monomers can be prepared from a reaction between a sulfonic acid halide V with an oxime VI in the presence of a base (Shirai et al. *J Polym. Sci., Part C: Polym. Lett.* 1986, Vol. 24, pp. 119–224) as illustrated below:

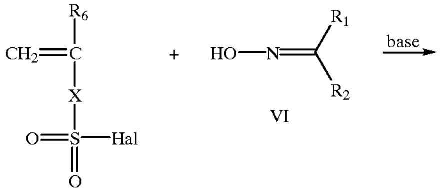

V VI

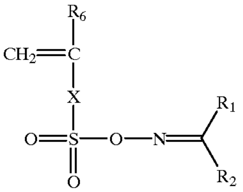

VII wherein $R_6$ is hydrogen, an aliphatic group having 1 to 6 carbon atoms or halo.

Sulfonic acid halide V may be easily prepared from the corresponding sodium or potassium salt of sulfonic acid (Kamogawa et al *Bull. Chem. Soc. Jpn.* 1983, Vol. 56, pp. 762–765) and oxime VI from ketone III (13allini et al *Chem. Lett.* 1997, pp. 475–476).

The polymers containing Y as an alkyl group undergo a pyrolytic elimination as taught in "Advanced Organic Chemistry" (pp. 1006–1010, March, J. John Wiley & Sons, New York, 1992, 4th ed.), as illustrated below for a representative preferred pendant sulfoalkyl group:

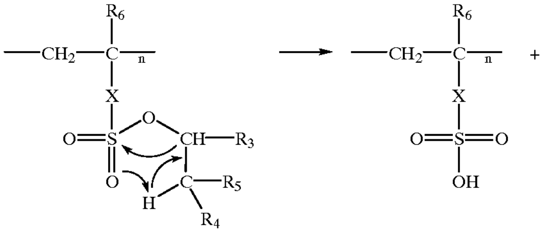

$CHR_3{=}CR_4R_5$

VIII

Hydrophilic sulfonic acid and elimination by-product VIII are generated.

Such polymers can be easily prepared from a monomer containing a sulfonate group represented by the general formula

IX

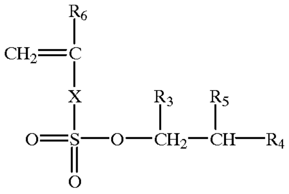

This above-said monomers may be prepared from a reaction between a sulfonic acid halide V with an alcohol X in the presence of a base (Organic Synthesis Collective Vol. 5, p. 366), illustrated as follows:

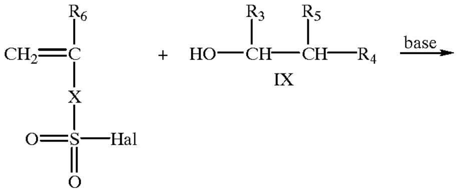

IX

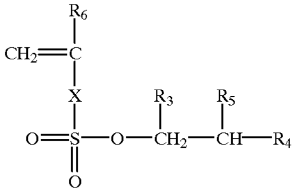

Representative synthetic methods for making ethylenically unsaturated polymerizable monomers and polymers useful in the practice of this invention are illustrated as follows:

SYNTHESIS EXAMPLE 1

Synthesis of α-tetralone oxime p-styrene sulfonate (1,2,3,4-tetra-1-naphthylideneamino p-styrenesulfonate): Monomer 1

α-Tetralone oxime (24 g) was dissolved in 150 ml of dichloromethane in a 500 ml round-bottomed flask, and cooled to 0 C. Triethylamine (23 ml) was added first and then p-styrenesulfonyl chloride (30.4 g) was added slowly to the solution to keep temperature below 5° C. The reaction mixture was stirred at 0° C. for 5 hours and then poured into 100 ml of ice-cold 10% HCl solution. The mixture was extracted with dichloromethane three times (100 ml each) and the combined organic layer was washed with water and brine and dried over anhydrous magnesium sulfate. The solvent was removed and the brown solid residue was recrystallized from hexane to obtain off-white crystalline α-tetralone oxime p-styrene sulfonate.

SYNTHESIS EXAMPLE 2

Synthesis of poly(methyl methacrylate-co-α-tetralone oxime p-styrene sulfonate)

Methyl methacrylate (1.4 ml), α-tetralone oxime p-styrene sulfonate (4.5 g) and azobisisobutylronitrile (hereafter referred to as AIBN, 60 mg) were dissolved in 8 ml of benzene in a 25 ml round-bottomed flask capped with a rubber septum. The solution was purged with dry nitrogen for 15 minutes and then heated at 60° C. for 14 hours. The product almost solidified and was diluted with 20 ml of dimethylformamide (hereafter referred to as DMF) and 10 ml of tetrahydrofuran (hereafter referred to as THF). The polymer was precipitated into 400 ml of methanol twice. The resulting white powdery polymer was collected by filtration and dried under vacuum at 40° C. overnight.

SYNTHESIS EXAMPLE 3

Synthesis of poly(α-tetralone oxime p-styrene sulfonate): Homopolymer 1

α-Tetralone oxime p-styrene sulfonate (3.7) g) and AIBN (39 mg) were dissolved in 8 ml of toluene in a 25 ml round-bottomed flask capped with a rubber septum. The solution was purged with dry nitrogen for 10 minutes and then heated at 60° C. for 20 hours. The solidified product was diluted with 30 ml of DMF and precipitated into 300 ml of ether. The resulting white powdery polymer was collected and dried under vacuum at 40° C. overnight.

SYNTHESIS EXAMPLE 4

Synthesis of poly[methyl methacrylate-co-α-tetralone oxime p-styrene sulfonate-co-2-(methacryloyloxy)ethyl acetoacetate]: Copolymer 1

Methyl methacrylate (0.52 ml), α-tetralone oxime p-styrene sulfonate (2.0 g), (methacryloyloxy)ethyl acetoacetate (0.19 ml), and AIBN (39 mg) were dissolved in 4.5 ml of benzene in a 25 ml round-bottomed flask capped with a rubber septum. The solution was purged with dry nitrogen for 15 minutes and then heated at 60° C. for 15 hours. The product was diluted with 20 ml of DMF and purified by precipitated into 200 ml of methanol. The white powdery polymer was filtered and dried under vacuum at 40° C. overnight.

SYNTHESIS EXAMPLE 5

Synthesis of α-tetralone oxime 3-methacryloyl-propane sulfonate: Monomer 2

A procedure like that described in Synthesis Example 1 was followed. α-Tetralone oxime (6.0 g) was reacted with 3-methacryloylpropane sulfonyl chloride (7.8 g) in 17 ml of pyridine to give a white crystalline product which was recrystallized from mixed solvent of hexane and diethyl ether.

SYNTHESIS EXAMPLE 6

Synthesis of poly(α-tetralone oxime 3-methacryloyl-propane sulfonate): Homopolymer 2

α-Tetralone oxime 3-methacryloylpropane sulfonate (1.5 g) and AIBN (14 mg) were dissolved in 3 ml of toluene in a 25 ml round-bottomed flask capped with a rubber septum. The solution was purged with dry nitrogen for 10 minutes and then heated at 60° C. for 16 hours. The solidified product was diluted with 15 ml of DMF and precipitated into 150 ml of methanol. The resulting white powdery polymer was collected and dried under vacuum at 40° C. overnight.

SYNTHESIS EXAMPLE 7

Synthesis of (2-methylsulfonyl)ethyl p-styrene sulfonate: Monomer 3

A procedure like that described in Synthesis Example 1 was followed. 2-(Methylsulfonyl)ethanol (6 g) was reacted with p-styrenesulfonyl chloride (11.8 g) in 50 ml of pyridine to give a white crystalline product that was recrystallized from diethyl ether.

SYNTHESIS EXAMPLE 8

Synthesis of poly[(2-methylsulfonyl)ethyl p-styrene sulfonate]: Homopolymer 3

2-(Methylsulfonyl)ethanol (4g) and AIBN (14 mg) were dissolved in 15 ml of DMF in a 25 ml round-bottomed flask capped with a rubber septum. The solution was purged with dry nitrogen for 10 minutes and then heated at 60° C. for 20 hours. The viscous product was diluted with 15 ml of DMF and precipitated into 400 ml of methanol. The resulting white powdery polymer was collected and dried under vacuum at 40° C. overnight.

SYNTHESIS EXAMPLE 9

Synthesis of 2-Phenylethyl p-Styrene Sulfonate: Monomer 4

2-Phenylethanol (3.1 g) was reacted with p-styrene sulfonyl chloride (5.3 g) and triethylamine (2.7 g) in 20 ml of dichloromethane for 3 hours to give the desired product as a light yellow viscous oil that was purified by passing through basic aluminum oxide.

SYNTHESIS EXAMPLE 10

Synthesis of 2-Cyanoethyl p-Styrene Sulfonate: Monomer 5

2-Cyanoethylanol (1.8 g) was reacted with p-styrene sulfonyl chloride (5.1 g) and triethylamine (2.5 g) in 20 ml of dichloromethane for 3 hours to give the desired product as a light yellow viscous oil.

SYNTHESIS EXAMPLE 11

Synthesis of Poly(2-phenylethyl p-styrene sulfonate)

Monomer 4 (1.5 g) and AIBN (16 mg) were dissolved in 4 ml of benzene. The solution was then purged with dry nitrogen for 10 minutes and heated at 60° C. for 14 hours. The resulting viscous product was diluted to 10 ml with DMF and precipitated into 100 ml of isopropanol. The resulting desired polymer was collected and dried under vacuum at 40° C. overnight.

SYNTHESIS EXAMPLE 12

Synthesis of Poly(2-phenylethyl p-styrene sulfonate-co-Methoxymethyl methacrylamide)

Monomer 4 (2.0 g), methoxymethyl methacrylamide (0.3 g) and AIBN (33 mg) were dissolved in 5 ml of DMF. The solution was purged with dry nitrogen for 10 minutes and heated at 60° C. for 14 hours. The resulting viscous product was diluted to 10 ml with DMF and precipitated into 100 ml of diethyl ether. The resulting desired polymer was collected and dried under vacuum at 40° C. overnight.

SYNTHESIS EXAMPLE 13

Synthesis of Poly(2-phenylethyl p-styrene sulfonate-co-1-vinyl-2-pyrrolidone)

Monomer 4 (2.0 g), 1-vinyl-2-pyrrolidinone (0.3 g) and AIBN (33 mg) were dissolved in 5 ml of DMF. The solution was purged with dry nitrogen for 10 minutes and heated at 60° C. for 14 hours. The viscous product was diluted to 10 ml with DMF and precipitated into 100 ml of diethyl ether. The resulting desired polymer was collected and dried under vacuum at 40° C. overnight.

Useful additional ethylenically unsaturated polymerizable monomers include, but are not limited to, acrylates (including methacrylates) such as ethyl acrylate, n-butyl acrylate, methyl methacrylate and t-butyl methacrylate, acrylamides (including methacrylamides), an acrylonitrile (including methacrylonitrile), vinyl ethers, styrenes, vinyl acetate, dienes (such as ethylene, propylene, 1,3-butadiene and isobutylene), vinyl pyridine and vinylpyrrolidone.

A mixture of heat-sensitive polymers described herein can be used in the imageable layer of the imaging members, but preferably only a single polymer is used. The polymers can be crosslinked or uncrosslinked when used in the imageable layer. If crosslinked, the crosslinkable moiety is preferably provided from one or more of the additional ethylenically unsaturated polymerizable monomers. The crosslinking cannot interfere with the transformation of the sulfonyl-containing group into a sulfonic acid group during imaging.

The surface imageable layer of the imaging member can include one or more of such homopolymers or copolymers, with or without minor (less than 20 weight % based on total layer dry weight) amounts of additional binder or polymeric materials that will not adversely affect imaging properties of the imageable layer. However, the surface imageable layer includes no additional materials that are needed for imaging, especially those materials conventionally required for wet processing with alkaline developer solutions.

The amount of heat-sensitive polymer(s) used in the imageable layer is generally at least 0.8 $g/m^2$, and preferably from about 1 to about 2 $g/m^2$ (dry weight). This generally provides an average dry thickness of from about 0.1 to about 10 $\mu$m. Greater amounts can be used if desired.

The imageable layer can also include one or more conventional surfactants for coatability or other properties, or dyes or colorants to allow visualization of the written image, or any other addenda commonly used in the lithographic art, as long as the concentrations are low enough so that there is no significant interference with layer imaging properties.

The heat-sensitive composition in the imageable layer also includes one or more photothermal conversion materials to absorb appropriate thermal energy from an appropriate source, such as a laser or thermal head, which radiation is converted into heat. Thus, such materials convert photons into heat phonons. Preferably, the radiation absorbed is in the infrared and near-infrared regions of the electromagnetic spectrum. Such materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. One particularly useful pigment is carbon of some form (for example, carbon black). The size of the pigment particles should not be more than the thickness of the layer. Preferably, the size of the particles will be half the thickness of the layer or less. Useful absorbing dyes for near infrared diode laser beams are described, for example, in U.S. Pat. No. 4,973,572 (DeBoer), incorporated herein by reference. Particular dyes of interest are "broad band" dyes, that is those that absorb over a wide band of the spectrum. Mixtures of pigments, dyes, or both, can also be used. Particularly useful infrared radiation absorbing dyes include bis(dichlorobenzene-1,2-dithiol)nickel(2:1) tetrabutyl ammonium chloride, tetrachlorophthalocyanine aluminum chloride, as well as those illustrated as follows:

IR Dye 1

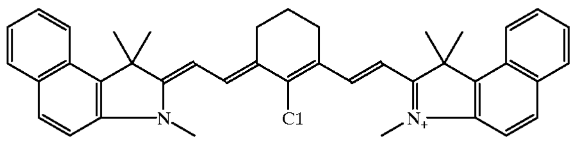

p-Toluenesulfonate

IR Dye 2 Same as Dye 1 but with $C_3F_7CO_2^-$ as the anion.

IR Dye 3

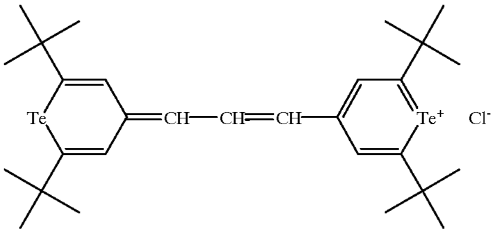

IR Dye 4

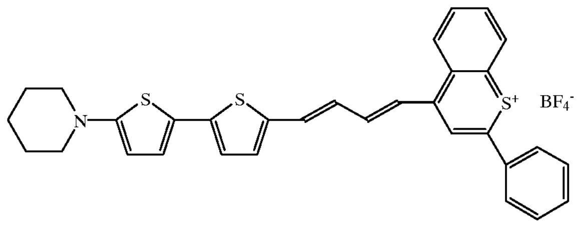

IR Dye 5

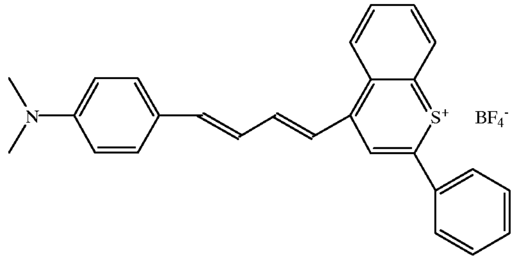

-continued

IR Dye 6

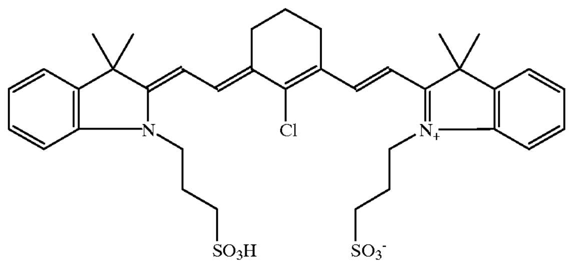

The photothermal conversion material(s) are generally present in an amount sufficient to provide an optical density of at least 0.3, and preferably at least 1.0. The particular amount needed for this purpose would be readily apparent to one skilled in the art, depending upon the specific material used.

The heat-sensitive composition is coated onto the support using any suitable equipment and procedure, such as spin coating, knife coating, gravure coating, dip coating or extrusion hopper coating.

The imaging members of this invention can be of any useful form including, but not limited to, printing plates, printing cylinders, printing sleeves and printing tapes (including flexible printing webs). Preferably, the imaging members are printing plates.

Printing plates can be of any useful size and shape (for example, square or rectangular) having the requisite heat-sensitive imageable layer disposed on a suitable support. Printing cylinders and sleeves are rotary printing members having the support and heat-sensitive layer in a cylindrical form. Hollow or solid metal cores can be used as substrates for printing sleeves.

During use, the imaging member of this invention can be exposed to any suitable source of thermal energy, such as a focused laser beam or thermal head, in the imaged areas, typically from digital information supplied to the imaging device. No heating, wet processing (such as with an alkaline developer), or mechanical or solvent cleaning is needed before the printing operation (although wiping or cleaning can be used if desired). A vacuum dust collector may be useful during the laser exposure step to keep the focusing lens clean. Such a collector is described in U.S. Pat. No. 5,574,493 (Sanger et al). A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Good printing steps are defined as those having a uniform optical density greater than 1.0. Specifications for lasers that emit in the near-IR region, and suitable imaging configurations and devices are described in U.S. Pat. No. 5,339,737 (Lewis et al), incorporated herein by reference. A laser typically emits in the region of maximum responsiveness in the imaging member, that is where the $\lambda_{max}$ closely approximates the wavelength were the imaging member absorbs most strongly.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between the imaging device (such as a laser beam) and the imaging member can be achieved by rotating the drum (and the imageable member mounted thereon) about its axis, and moving the imaging device parallel to the rotation axis, thereby scanning the imageable member circumferentially so the image "grows" in the axial direction. Alternatively, the imaging device can be moved parallel to the drum axis and, after each pass across the imageable member, increment angularly so that the image "grows" circumferentially. In both cases, after a complete scan, an image corresponding (positively or negatively) to the original document or picture can be applied to the surface of the imaging member.

In the flatbed configuration, a laser beam is drawn across either axis of the imageable member, and is indexed along the other axis after each pass. Obviously, the requisite relative motion can be produced by moving the imaging member rather than the laser beam.

Regardless of the manner in which the laser beam is scanned, it is generally preferable (for on-press uses) to employ a plurality of lasers and to guide their outputs to a single writing array. This array is then indexed, after completion of each pass across or along the imaging member, a distance determined by the number of beams emanating from the array, and by the desired resolution (that is, the number of image points per unit length). Off-press applications, which can be designed to accommodate very rapid plate movement and thereby utilize high laser pulse rates, can frequently utilize a single laser as an imaging source.

While laser imaging is preferred in the practice of this invention, any other imaging means can be used that provides thermal energy that can be directed in an imagewise fashion. For example, imaging can be accomplished using a thermoresistive head (or thermal printing head) in what is known as thermal printing, as described for example, in U.S. Pat. No. 5,488,025 (Martin et al). Such thermal printing heads are commercially available (for example as Fujitsu Thermal Head FTP-040 MCS001 and TDK Thermal Head F415 HH7-1089).

Without any wet processing steps (such as processing with an alkaline developer) after imaging, the imaging member is then used for printing by applying a lithographic ink to the image on its surface, in the presence of a fountain solution, and by transferring the ink to a suitable receiving material (such as cloth, paper, metal, glass or plastic) to provide a desired impression of the image thereon. An intermediate "blanket" roller can be used in the transfer of the ink from the imaging member to the receiving material. The imaging members can be cleaned between impressions, if desired, using conventional cleaning means. Thus, imaging and printing can be carried out without conventional "wet" processing. Hence, the imaging members of this invention are considered "processless" imaging members.

The following examples illustrate the practice of the invention, and are not meant to limit it in any way.

In these examples, a thermal IR-laser platesetter was used to image the printing plates, the printer being similar to that described in U.S. Pat. No. 5,168,288 (Baek et al), incorporated herein by reference. The printing plates were exposed using approximately 450 mW per channel, 9 channels per swath, 945 lines/cm, a drum circumference of 53 cm and an image spot (1/e2) at the image plane of about 25 micrometers. The test image included text, positive and negative lines, half tone dot patterns and a half-tone image. Images were printed at speeds up to 1100 revolutions per minute (the exposure levels do not necessarily correspond to the optimum exposure levels for the tested printing plates).

EXAMPLES 1–3

Imaging Members Incorporating Homopolymers

Heat-sensitive imaging formulations were prepared from the following components:

| | |
|---|---|
| Homopolymers 1–3 | 0.20 g |
| IR Dye 1 | 0.02 g |
| DMF | 0.50 g |
| THF | 4.5 g |

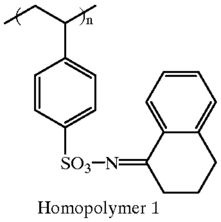

Homopolymer 1

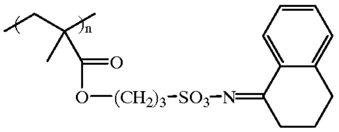

Homopolymer 2

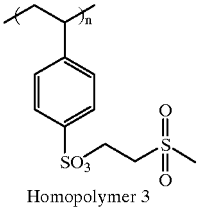

Homopolymer 3

Each formulation containing 4.21 weight % of solid was coated at 100 mg/ft$^2$ of dry coverage (1.08 g/m$^2$) on a 0.14 mm aluminum support which had been electrochemically grained and anodized and post treated with poly(vinyl phosphonic acid-co-acrylamide) at 80:20 weight ratio. The resulting printing plate was dried in a convection oven at 82° C. for 3 minutes, clamped on the rotating drum of an image setting machine, and digitally exposed to an 830 nm laser printhead at dosages ranging from 300 to 660 mJ/cm$^2$. The resulting blue-green coating rapidly discolored to a typically orange-tan color in the exposed regions. When black lithographic ink was applied to each exposed plate while under a stream of tap water, the non-exposed regions were found to readily accept ink whereas the exposed regions remained wet with water and free of ink.

A sample of each of the laser exposed plate was then mounted on the plate cylinder of a full page A.B. Dick lithographic duplicator press for actual press run. Each plate rolled up fast and printed with full density for several hundred printed sheets. The press results (number of acceptable sheets) are shown in TABLE 1.

TABLE 1

| Example | Homopolymer | Press Results (printed sheets) |
|---|---|---|
| 1 | 1 | 500 |
| 2 | 2 | 500 |
| 3 | 3 | 300 |

EXAMPLE 4

Imaging Members Incorporating Various Copolymers

Several heat-sensitive imaging formulations were prepared and coated on an aluminum support and dried as described in Examples 1–3 above, except Copolymers 1–4 were used as the heat-sensitive polymers in the imageable layer. Each resulting plate was imaged and evaluated as described in Examples 1–3. The results, summarized in TABLE 2 below, indicate that excellent photospeed and performance were achieved as long as the iminosulfonate moiety n≧(0.25) and that n, m, and p satisfy the relationship n+m+p=1. Copolymers 2–4 were prepared similarly to Copolymer 1, using the synthesis noted above.

TABLE 2

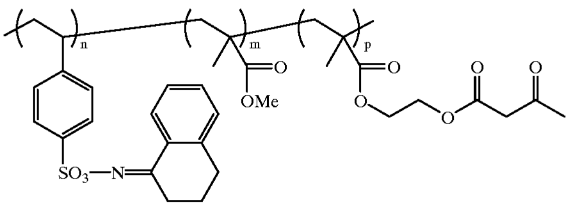

| | Copolymer | | | Press Results |
|---|---|---|---|---|
| Copolymer | n | m | P | (printed sheets) |
| 1 | 0.13 | 0.87 | 0 | none |
| 2 | 0.52 | 0.48 | 0 | 500 |
| 3 | 0.56 | 0.44 | 0 | 1000 |
| 4 | 0.50 | 0.42 | 0.08 | 500 |

EXAMPLES 5–6

Imaging Members Coated on Polyester Support

Two coatings were prepared as described in Examples 1 and 4, except they were coated on 0.18 mm poly(ethylene terephthalate) film support. They were exposed by the IR laser platesetter and test on the A.B. Dick press as described in Examples 1 and 4. Press results, summarized in TABLE 3, show that comparable performance was achieved whether the support was on hydrophilic aluminum or oleophilic polyester film, consistent with a processless, thermally switchable plate chemistry. The fact that the press run was artificially terminated after 200 impressions in these examples, as opposed to 500 in Examples 1 and 4, is not meant to be an indication of plate durability.

TABLE 3

| Example | Polymer | Press Results (printed sheets) |
|---|---|---|
| 5 | Homopolymer 1 | 200 |
| 6 | Copolymer 2 | 200 |

EXAMPLES 7–9

Use of Various IR Absorbing Materials

These examples demonstrate that various photothermal converters can be utilized in the imaging members of the invention.

Several heat-sensitive imaging formulations were prepared, coated on aluminum support and dried as described in Examples 1 and 4, except that various IR radiation absorbing materials, such as IR Dye 2 and carbon black instead of IR Dye 1 were used as photothermal converter. Each resulting plate was imaged and press tested in described in Examples 1 and 4. The results summarized in TABLE 4 below indicate comparable photospeed and performance were achieved with various dyes and carbon black pigment.

TABLE 4

| Example | Polymer | Dye or Pigment | Press Results (printed sheets) |
|---|---|---|---|
| 7 | Homopolymer 1 | IR Dye 2 | 1000 |
| 8 | Copolymer 2 | IR Dye 2 | 1000 |
| 9 | Homopolymer 1 | carbon black | 500 |

EXAMPLE 10

Chemical Resistance

A sample of the laser exposed plates described in Examples 1 and 4 was also tested for their ability to resist chemical attack by various solvents and press chemicals. The test requires swabbing a chemical with reasonable pressure over both exposed and unexposed areas of the plate for 90 seconds. The following solvents and plate chemicals were used in the tests: isopropanol, xylenes, acetone, 1-methoxy-2-propanol, KODAK™ Aqua-Image plate cleaner/preserver, KODAK™ MX1589 positive (alkaline) plate developer and an acidic commercial fountain solution. Both plates (Examples 1 and 4) passed the test for all the above chemicals.

The invention has been described in detail with particular reference to preferred embodiments thereof, but it will be understood that variations and modifications can be effected within the spirit and scope of the invention.

We claim:

1. A positive-working heat-sensitive imaging member comprising a support having thereon a heat-sensitive surface imageable layer comprising:

a) a heat-sensitive polymer comprising a heat-activatable sulfonate group, and b) a photothermal conversion material, said heat-activatable sulfonate group represented by structure I:

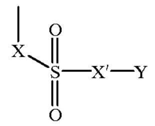

wherein X is a divalent linking group, X' is an oxygen or a sulfur atom, and Y is an imino group represented by —N═$CR_1R_2$ wherein $R_1$ and $R_2$ are independently hydrogen, an alkyl group, an acyl group or an aromatic group, or $R_1$ and $R_2$ taken together can provide the atoms necessary to form an alicyclic ring having from 5 to 15 carbon atoms in the ring.

2. The imaging member of claim 1 wherein:

$R_1$ and $R_2$ taken together can provide the atoms necessary to form an alicyclic ring having from 5 to 15 carbon atoms in the ring.

3. The imaging member of claim 2 wherein:

$R_1$ and $R_2$ taken together can provide the atoms necessary to form an unsubstituted alicyclic ring having from 5 to 14 carbon atoms in the ring.

4. The imaging member of claim 1 wherein X is a divalent aromatic group, or a group represented by $—COZ(CH_2)_n—$ wherein Z is an oxy or —NH— group, and n is 1 to 6.

5. The imaging member of claim 4 wherein X is phenylene or $—CONH(CH_2)_3—$.

6. The imaging member of claim 1 wherein said heat-sensitive polymer is a vinyl polymer.

7. The imaging member of claim 6 wherein said heat-sensitive polymer comprises recurring units of the structure II:

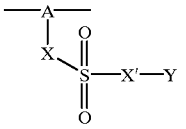

wherein A represents a polymeric backbone.

8. The imaging member of claim 7 wherein said recurring units of structure II comprise at least 25 mol % of the total recurring units in said heat-sensitive polymer.

9. The imaging member of claim 8 wherein said recurring units of structure II comprise from about 40 to about 100 mol % of all recurring units in said heat-sensitive polymer.

10. The imaging member of claim 9 wherein said heat-sensitive polymer is a copolymer derived from two or more different ethylenically unsaturated polymerizable monomers, at least one of said monomers containing said heat-activatable sulfonate group.

11. The imaging member of claim 10 wherein at least one of said monomers is an acrylate, an acrylamide, an acrylonitrile, a vinylether, a styrene, vinyl acetate, a diene, vinyl pyridine or vinylpyrrolidone.

12. The imaging member of claim 11 wherein at least one of said monomers is an acrylate, an acrylamide, or a styrene.

13. The imaging member of claim 1 wherein said photothermal conversion material is an infrared radiation absorbing material.

14. The imaging member of claim 13 wherein said photothermal conversion material is carbon black or one of the following IR radiation absorbing dyes:

IR Dye 1;

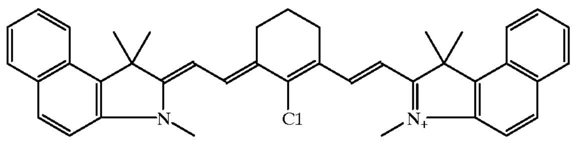

p-Toluenesulfonate

IR Dye 2 Same as Dye 1 but with $C_3F_7CO_2^-$ as the anion.;

IR Dye 3;

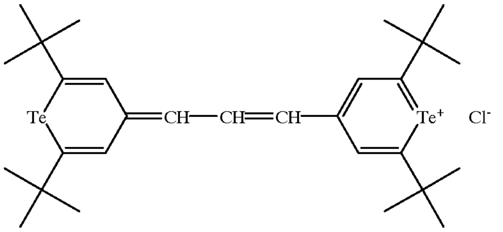

-continued

IR Dye 4;

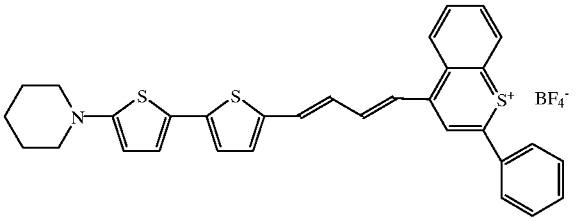

IR Dye 5;

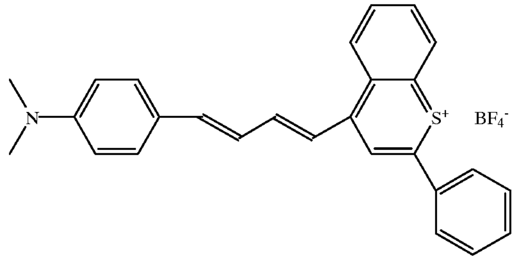

IR Dye 6;

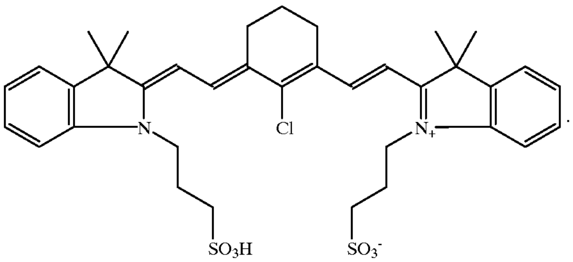

15. The imaging member of claim 1 that is a lithographic printing plate.

16. The imaging member of claim 1 wherein said support is a polyester or metal support.

17. A method of imaging comprising the steps of:

A) providing the positive-working imaging member of claim 1, and

B) imagewise exposing said imaging member to thermal energy to provide exposed and unexposed areas on the surface of said imaging member, whereby said exposed areas are rendered more hydrophilic than said unexposed areas.

18. The method of claim 17 wherein said imagewise exposure is carried out using an IR radiation emitting laser.

19. The method of claim 17 wherein said imagewise exposure is carried out using a thermal printing head.

20. The method of claim 17 carried out without any wet processing after imaging step B.

21. A method of printing comprising the steps of:

A) providing the positive-working imaging member of claim 1,

B) imagewise exposing said imaging member to the thermal energy to provide exposed and unexposed areas on the surface of said imaging member, whereby said exposed areas are rendered more hydrophilic than said unexposed areas, and C) without any wet processing, contacting said imagewise exposed imaging member with a lithographic printing ink, and imagewise transferring said printing ink to a receiving material.

22. A positive-working heat-sensitive imaging member comprising a support having thereon a heat-sensitive surface imageable layer comprising:

a) a heat-sensitive polymer comprising a heat-activatable sulfonate group; and b) a photothermal conversion material, said heat-activatable sulfonate group represented by structure I:

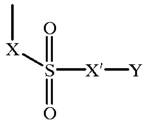

wherein X is a divalent linking group, X' is an oxygen atom, and Y is an imino group represented by $—N{=}CR_1R_2$ wherein $R_1$ and $R_2$ taken together can provide the atoms necessary to form an unsubstituted alicyclic ring having from 5 to 15 carbon atoms in the ring.

* * * * *

UNITED STATES PATENT AND TRADEMARK OFFICE
CERTIFICATE OF CORRECTION

PATENT NO. : 6,413,694 B1 
DATED : July 2, 2002
INVENTOR(S) : Zheng et al.

It is certified that error appears in the above-identified patent and that said Letters Patent is hereby corrected as shown below:

Title Page,
Item (56), References Cited, OTHER PUBLICATIONS: Under Pappas et al., "Kinetick" should read -- Kinetic --; and "Parmaeter" should read -- Parameter --

Column 3,
Line 21, "novolak" should read -- novolac --

Column 6,
Line 29, "represnets" should read -- represents --
Second structure, " 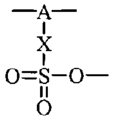 " should read -- 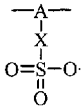 --

Column 7,
Line 61, "13allini" should read -- Ballini --

Column 8,
Line 30, "monomers" should read -- monomer --

Column 9,
Line 13, "azobisisobutylronitrile" should read -- azobisisobutyronitrile --
Line 28, "(3.7) g)" should read -- (3.7 g) --

Column 16,
Line 36, "test" should read -- tested --

Column 18,
Line 44, "IR Dye 1;" should read -- IR Dye 1 --
After structure of IR Dye 1, insert -- , -- (comma)
Line 54, "anion.;" should read -- anion, --
Line 56, "IR Dye 3;" should read -- IR Dye 3 --
After structure of IR Dye 3, insert -- , -- (comma)

UNITED STATES PATENT AND TRADEMARK OFFICE

CERTIFICATE OF CORRECTION

PATENT NO. : 6,413,694 B1
DATED : July 2, 2002
INVENTOR(S) : Zheng et al.

It is certified that error appears in the above-identified patent and that said Letters Patent is hereby corrected as shown below:

Column 19,
Line 2, "IR Dye 4;" should read -- IR Dye 4 --
After structure of IR Dye 4, insert -- , -- (comma)
Line 11, "1R Dye 5;" should read -- IR Dye 5 --
After structure of IR Dye 5, insert -- , -- (comma)
Line 44, "IR Dye 6;" should read -- IR Dye 6 --
After structure of IR Dye 6, insert -- . -- (period)

Signed and Sealed this

Twenty-eighth Day of January, 2003

JAMES E. ROGAN
*Director of the United States Patent and Trademark Office*